United States Patent [19]

Hori et al.

[11] Patent Number: 4,739,511
[45] Date of Patent: Apr. 19, 1988

[54] HEARING AID

[75] Inventors: Kiyoharu Hori, Hino; Takuo Yamamoto, Fussa; Tetsuyoshi Hara, Oume, all of Japan

[73] Assignee: Rion Kabushiki Kaisha, Japan

[21] Appl. No.: 821,188

[22] Filed: Jan. 22, 1986

[30] Foreign Application Priority Data

Jan. 25, 1985 [JP] Japan .................................. 60-12305
Feb. 14, 1985 [JP] Japan .................................. 60-26732

[51] Int. Cl.⁴ .............................................. H04R 3/00
[52] U.S. Cl. ..................... 381/68; 381/68.2; 381/69.1
[58] Field of Search ................ 381/68, 30, 31, 68.2, 381/68.4, 69.1; 179/107 R, 107 FD; 330/251, 10

[56] References Cited

U.S. PATENT DOCUMENTS

| | | | |
|---|---|---|---|
| 4,063,048 | 12/1977 | Kissiah | 179/107 R |
| 4,207,441 | 6/1980 | Ricard | 179/107 R |
| 4,581,491 | 4/1986 | Boothroyd | 381/68 |
| 4,593,696 | 6/1986 | Hochmair | 381/68 |
| 4,617,913 | 10/1986 | Eddington | 179/107 R |
| 4,689,819 | 8/1987 | Killion | 381/68 |

Primary Examiner—Jin F. Ng
Assistant Examiner—L. C. Schroeder
Attorney, Agent, or Firm—Beveridge, DeGrandi & Weilacher

[57] ABSTRACT

A hearing aid having a comparator or comparators which compare speech sound signals obtained by a first transducer with reference voltage(s) as slice level(s) formed from a standard voltage and which output time series square wave containing frequency information according to the relations of amplitude between the speech sound signals and the slice level(s).

The time series square wave is output as mechanical vibrations, which is easy to adjust the level for hearing impaired persons having a narrow dynamic range.

Comparators may be provided for both positive and negative sides and may be divided into plural numbers in order to raise the identification score and information content.

9 Claims, 7 Drawing Sheets

HEARING AID

BACKGROUND OF THE INVENTION

1. Field of the Invention

This invention relates to a hearing aid which amplifies sounds for the hearing impaired.

2. Prior Art

A hearing aid is fundamentally a sound amplifier and usually comprises a microphone, an amplifier and one or two earphones. However, various transducers in place of the earphone have been used recently, such as a bone receiver, a vibrator which contacts the stapes and acicular electrodes which extend into the cochlea and which are applied to middle ear implants or cochlea implants.

The above-mentioned sound amplifier not only amplifies the sound but also processes the sound by using various additional functions.

In detail, a hearing aid processes the sound mainly for frequency and level of the sound elements. For example, a high frequency zone is often emphasized or a loudness level is controlled by a maximum output power control means so that the loudness level does not exceed a loudness threshold which causes discomfort. Thus, the sound is adjusted according to the hearing ability of the hearing impaired.

Usually, the hearing impaired person has a narrower dynamic range compared with that of a person with normal hearing. This dynamic range is defined as the difference obtained when the hearing threshold level (HTL) is subtracted from the threshold of loudness causing discomfort or the uncomfortable loudness threshold (UCL).

UCL is the maximum loudness which the hearer can endure, and HTL is the minimum loudness level which the hearer can recognize.

In the normal case, the UCL is generally between 100 to 110 dB HL (Hearing Level which is measured by an audiometer) and in the case of the hearing impaired, the UCL is generally between 110 and 120 dB HL. Since the dynamic hearing range of a hearing impaired person with mild impairment who has 70 dB HL of HTL is 120 dB−70 dB=50 dB, such a person can understand normal conversation when the speaking voice is amplified by using an ordinary hearing aid so that the voice would be included within the dynamic range.

However, in the case of a hearing impaired person with severe impairment such as 110 dB to 120 dB HL of HTL, the dynamic range will be:

120 dB−100 (or 110) dB=20 dB (or 10 dB).

In such a narrow dynamic range, it is impossible for the person to understand all speech sounds even if the sound level is raised using a hearing aid.

That is, as to vowels, since the difference between the effective value and the peak factor is 15 to 20 dB, the hearing impaired person can hear essentially only the peak factor part, and as to consonants, since the energy level of consonants is lower than that of vowels by approx. 15 to 30 dB, the syllable identification score would be rather low. Further, if the speech sound level is lower than usual, sound information content in excess of the HTL will be decreased and the syllable identification score will be less.

As described above, prior art hearing aids do not perform well enough to compensate for hearing difficulty caused by the narrow dynamic range of the hearing impaired, especially persons with severe impairment, because the prior art hearing aids only amplifys the level of speech sound in various frequency ranges.

SUMMARY OF THE INVENTION

Accordingly, it is an object of the present invention to provide a hearing aid which can transmit sound information to a hearing impaired person who has a narrow dynamic range without decreasing the identification score.

It is another object of the present invention to provide a hearing aid which can adjust an output dynamic range to a desired value.

In accordance with the present invention, there is provided a hearing aid comprising a first transducer which converts speech sound into electrical signals, an amplifier which amplifies said electrical signals, a generator which provides a standard voltage, a comparator which compares the output of said amplifier with a reference voltage as a slice level formed from said standard voltage and which provides a time series square wave containing speech sound frequency information, and a second transducer which converts said series square wave into mechanical vibrations.

DESCRIPTION OF THE PREFERRED EMBODIMENT

Figure 1:
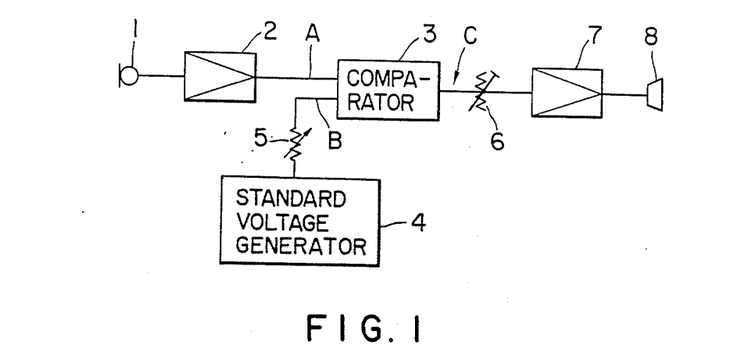
FIG. 1 is a block diagram of a hearing aid according to the invention.
Figure 2:
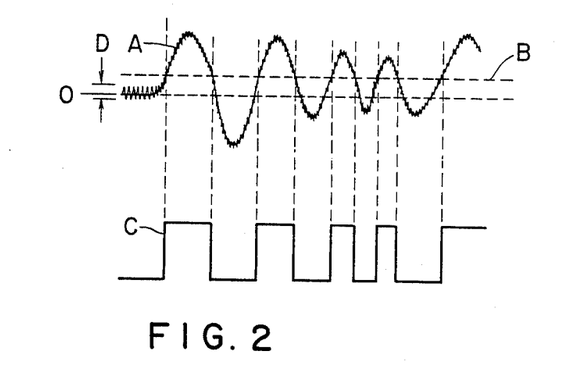
FIG. 2 and FIG. 3 are useful in understanding the slicing operation in the hearing aid shown in FIG. 1.

FIG. 1 is a block diagram of an embodiment of the present invention and FIG. 2 is a time chart of waveforms obtained in some points shown in FIG. 1.

According to FIG. 1, a microphone 1 converts the speech sound signal from a sound wave into an electrical signal. This signal is amplified by an amplifier 2 to obtain speech sound wave A of FIG. 2. This wave contains external noises having the level D. The speech sound wave A and a predetermined standard d.c. voltage generated by standard voltage generator 4 and converted into a desired voltage (slice level B) by an attenuator 5 are applied to the two inputs terminals of a comparator 3 which provides a predetermined constant level (high level) signal when the speech sound wave A is higher than the slice level B and which provides a "0" level (low level) signal when the speech sound wave A is lower than the slice level B.

Figure 3:
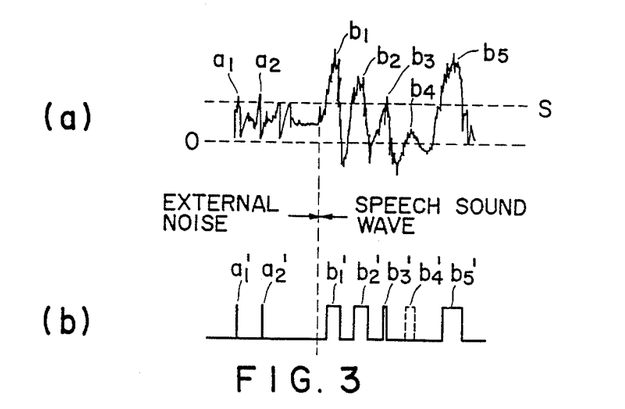

Referring to FIG. 3, the relations between the comparator 3 and the attenuator 5 are explained. In FIG. 3(a), the left part shows the external noise D and the right part shows the speech sound signal with external noises. When these waveforms are sliced by a slice level S determined by adjusting the attenator 5a, time series square wave is obtained as shown in FIG. 3(b). That is, for the external noises, the points $a_1$ and $a_2$ at which the sound level exceeds slice levels are detected as pulses $a_1'$ and $a_2'$ by the comparator 3, and for a speech sound wave, the points $b_1$, $b_2$, $b_3$ and $b_5$ at which the sound level exceeds slice level S are detected as a time series square wave $b_1'$, $b_2'$, $b_3'$ and $b_5'$ by the comparator 3, but the low level speech sound signal $b_4$ is not detected. Thus when a hearing aid is used in the noisy place where the noise level is lower than the speech sound, the external noise is fairly well removed raising the signal to noise ratio. When a hearing aid is used in the quiet place where the noise level is low, the identification score can be raised by lowering the slice level.

The output of the comparator 3 is a time series square wave whose pulse width corresponds to the amplitude of the speech sound wave, as shown at C in FIG. 2. The serial square wave C has its level adjusted by a semifixed resistor 6, amplified by a power amplifier 7 and then converted into the sound wave by a receiver 8. The semifixed attenuator 6 adjusts a sound pressure level within the dynamic hearing range according to the hearing impairment.

In this embodiment, since the sound wave as the output of the receiver is the series square wave having constant level, it is easy to adjust the level within the dynamic range of the hearing impaired.

Figure 4:
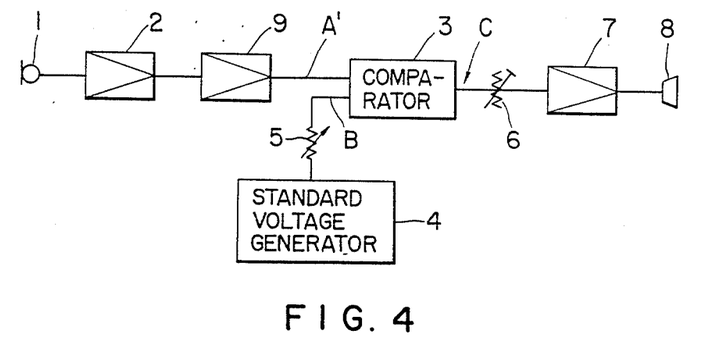
FIG. 4 is a block diagram of another embodiment of the hearing aid of the invention.

FIG. 4 shows another embodiment of the present invention.

In this embodiment, a preprocessing amplifier 9 is added between the amplifier 2 and the comparator 3.

Figure 5:
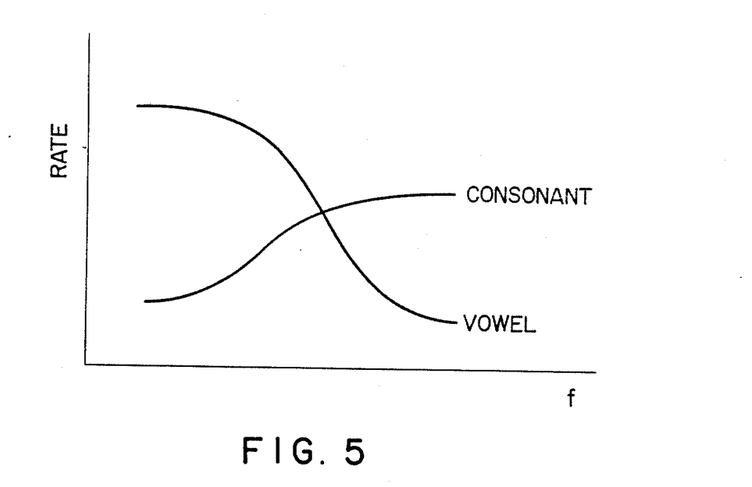
FIG. 5 is a frequency distribution plot illustrating the distribution of the frequency components of vowels and consonants.
Figure 6:
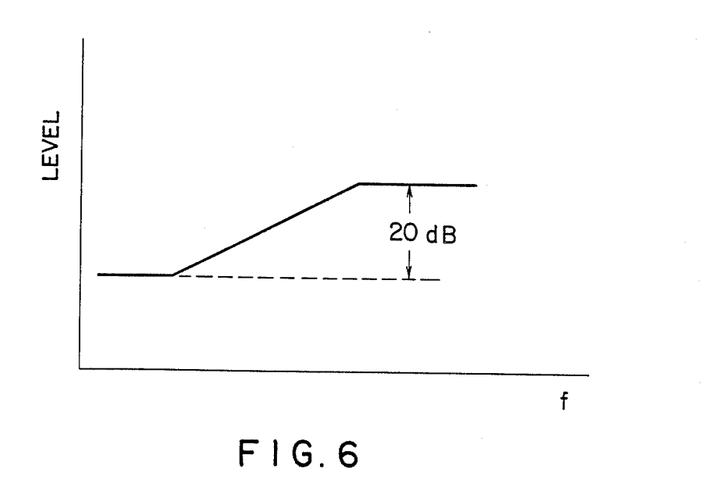
FIG. 6 is a plot of the frequency characteristics of the preprocessing amplifier shown in FIG. 4.

This preprocessing amplifier 9 has characteristics in which the low frequency zone is suppressed and consequently the high frequency zone is emphasized. As described before consonants such as (s), ($\int$), (t), (k), (f), (p), etc. have frequency distribution characteristics in which high frequency components no less than 2 kHz are major. On the contrary, the vowels have frequency distribution characteristics in which formants F1-F3 are included within a 100 Hz-3 kHz range. These are illustrated in FIG. 5. In the use of the hearing aid, external noises which have a frequency spectrum similar to the spectrum of the vowels may prevent consonants from being heard. Therefore this preprocessing amplifier has frequency characteristics as shown in FIG. 6, and this amplifier reduces the external noises and improves the identification score. The level difference between the low frequency zone and the high frequency zone of the preprocessing amplifier 9 is 20 dB which equals the energy difference between the consonants and the vowels.

Figure 7:
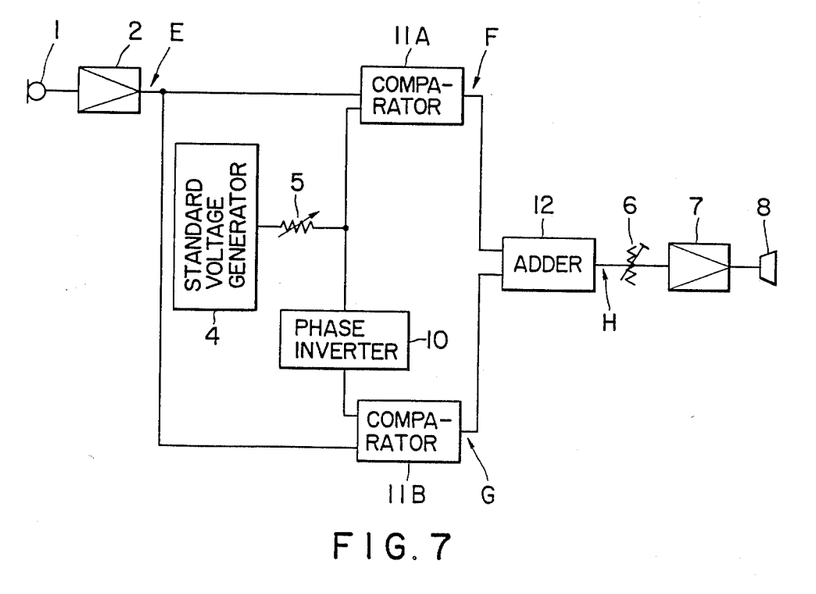
FIG. 7 is a block diagram of still another embodiment of the hearing aid of the invention.
Figures 10, 11:
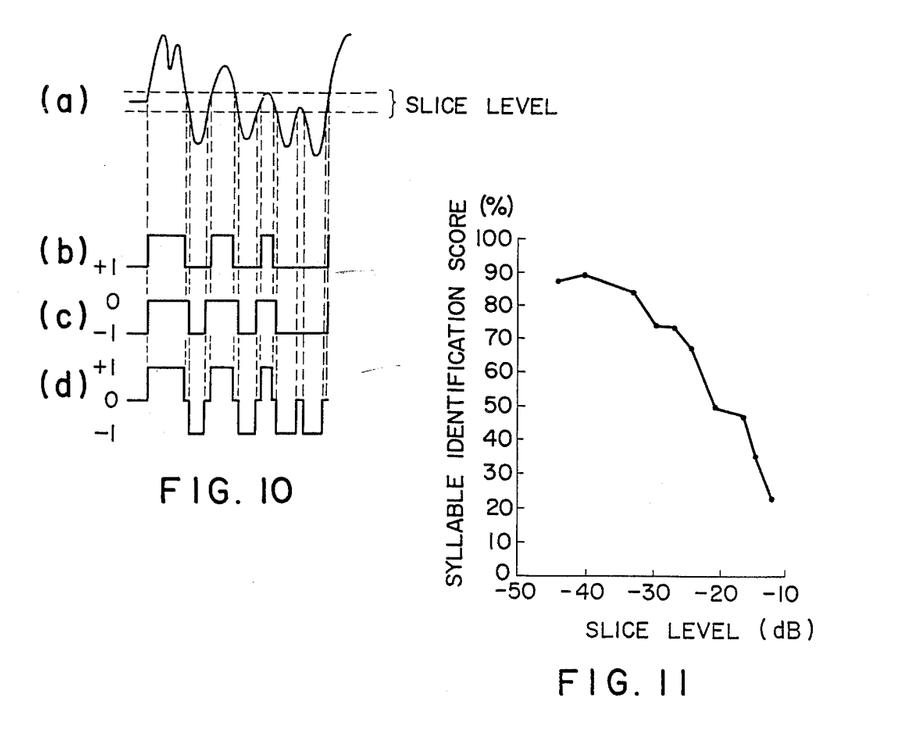
FIG. 10 is a timing diagram useful for understanding yet another particular slicing operation.
FIG. 11 is a graph showing the relation between the slice level and the syllable identification score.

FIG. 7 shows a further embodiment of the present invention, and FIG. 10 is a timing diagram showing waveforms obtained at various points indicated in FIG. 7.

In this embodiment, a microphone 1, an amplifier 2, a standard voltage generator 4, an attenuator 5, a semifixed attenuator 6, a power amplifer 7 and a receiver 8 have the same function as the embodiment of in FIG. 1. The sound wave converted into an electrical signal by the microphone 1 is amplified to the predetermined value and the speech sound wave E is obtained. The speech sound wave E is applied to terminals of comparators 11A and 11B, and the standard voltage generated by the standard voltage generator 4 and adjusted to a desired value by the attenuator 5 is applied to the other terminal of the comparator 11A. The phase of the signal having the standard voltage adjusted by the attenuator 5 is inverted by the phase inverter 10 and the resulting signal is applied to the other terminal of comparator 11B. The output signals F and G of comparators 11A and 11B are added by an adder 12, and the output H of the adder 12 is supplied to the power amplifier 7 through the semifixed attenuator 6.

Thus in this embodiment, the speech sound wave is clipped by the positive side slice level and the negative side slice level.

Figure 8:
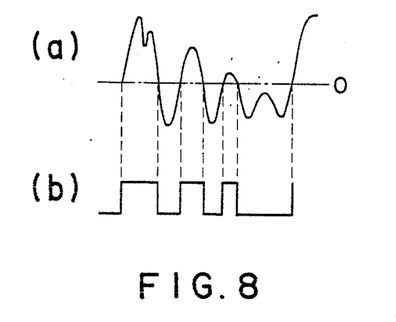
FIG. 8 is a timing diagram useful for understanding a particular slicing operation.
Figure 9:
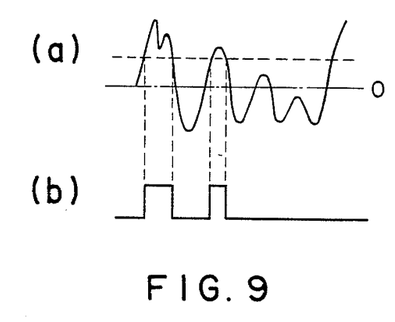
FIG. 9 is a timing diagram useful for understanding another particular slicing operation.

FIGS. 8, 9 and 10 aid in explaining the reason for providing a plurality of slice levels. As shown in FIG. 8, if the slice is 0 level or near the 0 level, both positive and negative side information is obtained. However, as shown in FIG. 9, if the speech sound wave has an asymetric form and the slice level is above the 0 level, a part of the negative side information is cut, resulting in an adverse effect on the identification score. As illustrated in FIG. 10, two comparator levels (slice levels) are used and the sliced positive and negative information (FIGS. 10(b) and (c)) is added. Consequently, the time series square wave which contains both positive and negative information is obtained as shown in FIG. 10(d).

In this embodiment, the time series square wave carries time information or pitch information of the speech sound wave to the hearing organs. The syllable identification score depends on the slice level as shown in FIG. 11, that is, when the slice level is near the 0 level, an approximately 90% syllable identification score is obtained. If the syllable identification score is 65% or more, the word identification score and the sentence identification score are 80 to 100%, and therefore it is not inconvenient for the hearing impaired to have a conversation. Moreover, in the method of changing the level of the speech sound, the identification score lowers as the sound level approaches the HTL. However, in the method of the present invention, the hearing level is only one level, that is, a binary 1 or 0. As a result, the identification score will not be decreased even if the level of the speech sound is changed unless the speech sound has a level lower than the HTL and has the same time information content.

Figure 12:
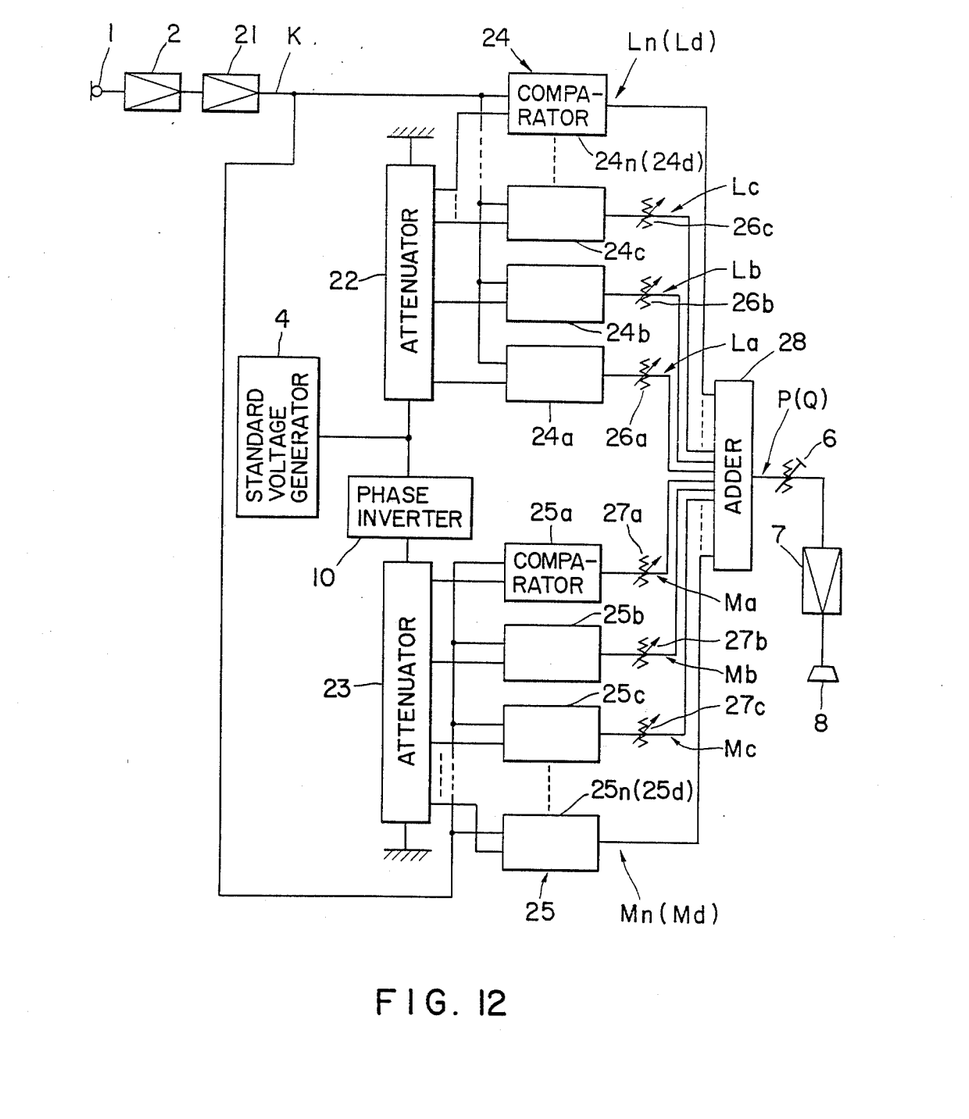
FIG. 12 is a block diagram of a further embodiment of the invention.
Figure 13:
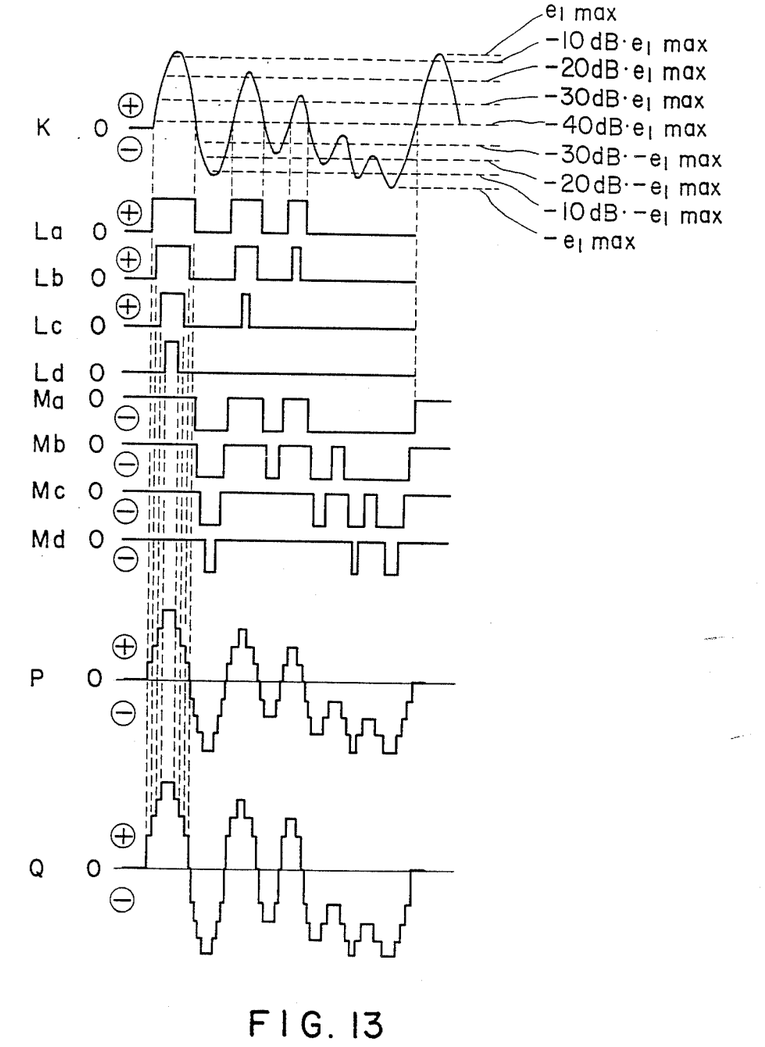
FIG. 13 is a timing diagram useful for understanding the operation of the embodiment shown in FIG. 12.

FIG. 12 shows a still further embodiment of the present invention, and FIG. 13 is a timing diagram showing the waveforms obtained at various points in the block diagram of FIG. 12.

According to FIG. 12, a microphone 1 converts the speech sound signal from a sound wave to an electrical signal, and this signal is amplified by an amplifier 2 and a preprocessing amplifier 21 as described with respect to the embodiment of FIG. 4.

The output of the preprocessing amplifier 21 is applied to one input terminal of each of n units of positive side comparators 24a to 24n and n negative side comparators 25a to 25n. Reference voltages generated by standard voltage generator 4 and adjusted by attenuators 22 and 23 are applied to the other input terminals of the comparators 24a to 24n and 25a to 25n. For the negative side, the phase of the signal having the standard voltage is inverted by a phase inverter 10 and the signal is applied to the attenuator 23.

When the speech sound wave K is higher than the reference voltages, the comparators provides an output level "1" (high) signal, and when the absolute value of the negative side of the speech sound wave K is higher than the reference voltages, the comparators 25a-25n provide a level "1" signal. Similarly, when the absolute value of the speech sound wave K is lower than the reference levels, the comparators 24a-24n and 25a-25n provide level "0" (low) signals.

The relations between attenuators 22, 23 and comparators 24, 25 are described as follows.

For example, where n=4, the maximum voltage of the speech sound wave=$e_1$max, the reference voltage=$e_2$max, with $e_1$max=$e_2$max, and the attenuator 22 provides reference voltage of $-10$ dB $e_1$max for comparator 24a, a reference voltage of $-20$ dB $e_1$max for comparator 24b, a reference voltage of $-30$ dB $e_1$max for comparator 24c, and a reference voltage of $-40$ dB $e_1$max for comparator 24d. Under such attenuator characteristics, series square waves La, Lb, Lc and Ld, each of which is a sliced speech sound wave for 40 dB, are obtained from comparators 24a-24n. For the negative side, the same operation is perfomed and series square waves Ma, Mb, Mc and Md are obtained from comparators 25a-25n. The outputs of comparators 24 and 25 are applied to an adder 28 via attenuators 26a-26c and 27a-27c except for the lowest level comparators 24d and 25d. The adder 28 provides the stepwise waveform P as shown in FIG. 13. If the attenuations of the attenuators 26 and 27 are 0, the step difference of the waveform P is 6 dB because waves having the same levels are superimposed. Consequently, the waveform P has a dynamic range of 18 dB as a whole. Similarly if the attenuation is ½, the stepwise waveform will be Q in FIG. 13, which has steps having ratios of 1:1.5:2:2.5, whereby, the dynamic range is 7.96 dB.

Thus the dynamic range of the output can be varied by adjusting the attenuators 26 and 27 without changing the level information content.

The reason why no attenuators are connected to comparators 24d and 25d which provide the lowest level waveforms is to maintain the standard level. That is, if the output levels of comparators 24d and 25d are controllable, all comparator outputs are similarly changed in level, thus the dynamic range is not variable. Therefore, adjusting the lowest level to the HTL level and varying the outputs of comparators 26a-26c and 27a-27c so that the highest level does not exceed the UCL makes it possible to change the dynamic range.

The stepwise waveform P or Q is applied to the amplifier 7 through an attenuator 6 which is used to adjust the level according to the hearing range of the user and the wave P is amplified and supplied to the receiver 8 to transform the wave to mechanical vibrations.

Figure 14:
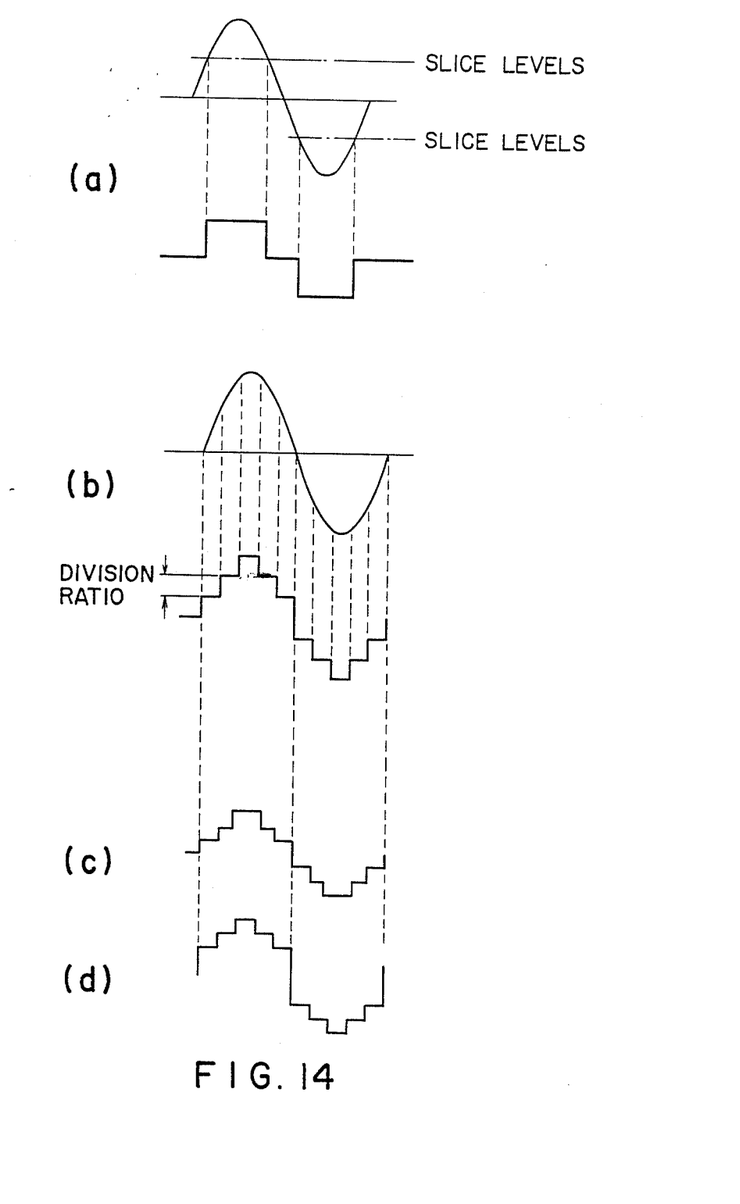
FIG. 14 is a diagram useful in understanding operation of the invention.

The division number and division ratio of the attenuators are determined by the dynamic range needed. The division ratio is defined as the attenuation ratio of the upper step and the lower step. FIG. 14 illustrates the effect of the division number and the division ratio. More divisions result in better resolution as shown in FIGS. 13(a) and (b). However, if a large division number is used, when the division ratio is small as shown in FIG. 14, the speech sound information content is less though the resolution is increased partially. Therefore a large number of divisions and an equally divided ratio are very effective to raise the resolution and to obtain much information regarding the content of the speech sound wave.

As described above, according to the present invention, the tone quality and the identification score can be raised by dividing the level information of series square wave by an integer n. Accordingly, the present invention is suited as a hearing aid for hearing impaired persons with severe impairment.

In the above embodiments, the receiver is described as a transducer. However, a vibrator whose tip is secured to the stapes can be used in place of the receiver and the whole hearing aid can be implanted in the body to thereby form a middle ear implant. Similarly, acicular electrodes can be inserted into the cochlea in place of a receiver and the whole hearing aid can be implanted in the body to thereby form a cochlea implant. These implant methods are established and known.

The preferred embodiments described herein are illustrative and not restrictive, the scope of the invention being indicated by the appended claims and all variations which come within the meaning of the claims are intended to be embraced therein.

What is claimed is:

1. A hearing aid comprising:
  a first transducer for detecting speech sound and providing electrical output signals indicative thereof;
  an amplifier for receiving said electrical signals as an input and providing amplified output signals;
  a generator for providing a standard voltage;
  means for forming a reference voltage from said standard voltage;
  a comparator for receiving the reference voltage and the amplified signals as inputs and comparing the amplified signals with the reference voltage as a slice level and for providing a predetermined high level signal when said amplified signals exceed the slice level and a low level signal when said amplified signals are below the slice level, said high and low level signals forming time series square waves containing frequency information derived from detected speech sound; and
  a second transducer for receiving said time series square wave as an input and providing as an output mechanical vibrations to produce sound within the dynamic hearing range of a hearing-impaired person.

2. A hearing aid according to claim 1, wherein said means for forming a reference voltage is a variable attenuator whereby the reference voltage and thus the slice level are adjustable.

3. A hearing aid according to claim 2, which further comprises a preprocessing means for receiving the amplified signals as an input and providing an output having the high frequency components of the speech sound emphasized.

4. A hearing aid comprising:
  a first transducer for converting speech sound into electrical signals;
  an amplifier for amplifying the electrical signals;
  a generator for providing a standard voltage;
  means for forming from the standard voltage reference voltages having a positive side and negative side;

positive side and negative side comparators for comparing the output of said amplifier with said reference voltages as slice levels and for providing predetermined high level signals when the amplified electrical signals are higher than the absolute value of the slice levels and low level signals when the amplified electrical signals are lower than the absolute value of the slice levels, the high and low level signals forming time series square waves containing frequency information derived from the speech sound;

an adder for adding the said signals from said comparators; and a second transducer for converting the output of said adder into mechanical vibrations.

5. A hearing aid according to claim 4, wherein said means for forming reference voltages comprises a variable attenuator voltages, whereby the reference voltage and thus the slice levels are adjustable.

6. A hearing aid according to claim 4, which further comprises a preprocessing means which emphasizes a high frequency component of said speech sound.

7. A hearing aid according to claim 4, wherein said comparators comprises n positive side comparators and n negative side comparators, each of said positive side comparators receiving a different level reference voltage and each of said negative side comparators receiving a different level reference voltage.

8. A hearing aid according to claim 7, wherein said means for forming reference voltages outputs a plurality of different voltages for said comparators.

9. A hearing aid according to claim 8, wherein said means for forming reference voltages further comprises a plurality of attenuators having variable attenuation ratios.

* * * * *